(12) United States Patent
Lee et al.

(10) Patent No.: US 10,055,070 B2
(45) Date of Patent: Aug. 21, 2018

(54) FLAT DISPLAY APPARATUS AND METHOD OF MANUFACTURING THE SAME

(71) Applicant: SAMSUNG DISPLAY CO., LTD., Yongin-si, Gyeonggi-do (KR)

(72) Inventors: Minwoo Lee, Yongin-si (KR); Minsang Kim, Yongin-si (KR); Seungyong Song, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/964,509

(22) Filed: Dec. 9, 2015

(65) Prior Publication Data

US 2016/0364053 A1 Dec. 15, 2016

(30) Foreign Application Priority Data

Jun. 15, 2015 (KR) .................. 10-2015-0084336

(51) Int. Cl.
*G06F 3/044* (2006.01)
*H01L 27/32* (2006.01)
*H01L 51/52* (2006.01)

(52) U.S. Cl.
CPC ............ *G06F 3/044* (2013.01); *H01L 27/323* (2013.01); *H01L 27/3276* (2013.01); *G06F 2203/04103* (2013.01); *H01L 51/524* (2013.01)

(58) Field of Classification Search
CPC ................. C12Q 1/703; C12Q 1/6806; G01N 33/56988; G01N 33/553; G01N 33/531
See application file for complete search history.

(56) References Cited

U.S. PATENT DOCUMENTS

| 2008/0117182 | A1* | 5/2008 | Um | G06F 3/0412 345/173 |
|---|---|---|---|---|
| 2011/0242021 | A1* | 10/2011 | Jun | G06F 3/044 345/173 |
| 2011/0248260 | A1* | 10/2011 | Yamazaki | H01L 29/78606 257/43 |
| 2011/0316802 | A1* | 12/2011 | Choi | G06F 3/041 345/173 |

FOREIGN PATENT DOCUMENTS

| JP | 2014-067599 A | 4/2014 |
|---|---|---|
| KR | 10-2011-0048686 A | 5/2011 |
| KR | 10-2012-0000133 A | 1/2012 |
| KR | 10-2014-0087470 A | 7/2014 |

* cited by examiner

*Primary Examiner* — Shaheda Abdin
(74) *Attorney, Agent, or Firm* — Lewis Roca Rothgerber Christie LLP

(57) ABSTRACT

A flat display apparatus includes a first substrate, a display unit on the first substrate, a second substrate opposite the first substrate, a touch screen layer on a bottom surface of the second substrate that faces the display unit, a protection layer on the bottom surface of the second substrate, covering the touch screen layer, and including an inorganic layer, and a sealing member between the first substrate and the protection layer, surrounding the display unit, and binding the first and second substrates together by binding to the inorganic layer of the protection layer.

18 Claims, 4 Drawing Sheets

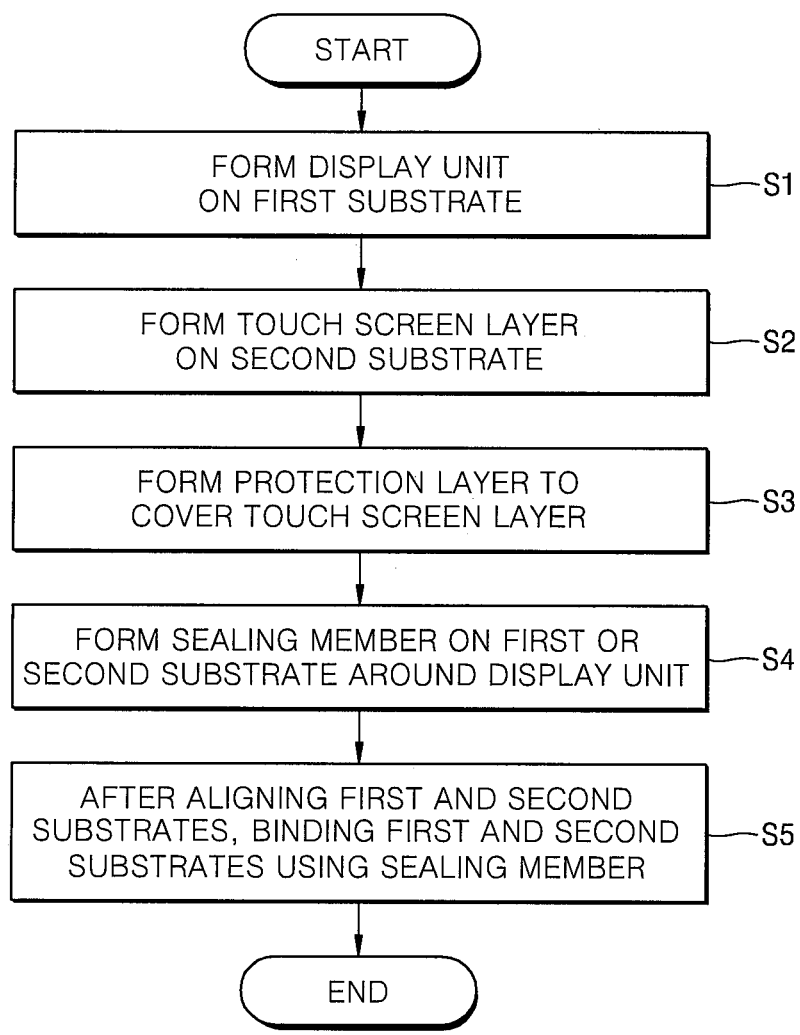

FLAT DISPLAY APPARATUS AND METHOD OF MANUFACTURING THE SAME

CROSS-REFERENCE TO RELATED APPLICATION

This application claims priority to, and the benefit of, Korean Patent Application No. 10-2015-0084336, filed on Jun. 15, 2015 in the Korean Intellectual Property Office, the disclosure of which is incorporated herein in its entirety by reference.

BACKGROUND

1. Field

One or more exemplary embodiments relate to a flat display apparatus, and a method of manufacturing the flat display apparatus.

2. Description of the Related Art

Recently, the trend in display apparatuses is directed toward the use of plate type flat display apparatuses. Among different types of flat display apparatuses, self-luminous electroluminescent display apparatuses have wide viewing angles, high contrast, and quick responsiveness, and are thus considered to be the next generation of displays. Particularly, organic light emitting display apparatuses, in which a light emitting layer includes an organic material, has high brightness, has improved driving-voltage and responsiveness characteristics, and has a multi-color display ability, when compared to inorganic light emitting display apparatuses.

In addition, technology for applying a touch panel function to a display apparatus has been researched concurrently with the effort of developing various types of electronic devices. If a display apparatus has a touch panel function, a user may input information by touching a surface of the display apparatus with his/her fingers or with a pen, and the user may also view images on the display apparatus.

SUMMARY

One or more exemplary embodiments include a flat display apparatus and a method of manufacturing the flat display apparatus.

Additional aspects will be set forth in part in the description that follows and, in part, will be apparent from the description, or may be learned by practice of the presented embodiments.

According to one or more exemplary embodiments, a flat display apparatus includes a first substrate, a display unit on the first substrate, a second substrate opposite the first substrate, a touch screen layer on a bottom surface of the second substrate that faces the display unit, a protection layer on the bottom surface of the second substrate, covering the touch screen layer, and including an inorganic layer, and a sealing member between the first substrate and the protection layer, surrounding the display unit, and binding the first and second substrates together by binding to the inorganic layer of the protection layer.

The inorganic layer may include at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The protection layer may have a thickness of about 2 μm to about 100 μm.

The protection layer may have a thickness of about 10 μm to about 50 μm.

The protection layer may further include an organic layer that is between the bottom surface of the second substrate and the inorganic layer, and that covers the touch screen layer.

The inorganic layer may cover the organic layer, and may contact the second substrate at a region surrounding the organic layer.

The organic layer may include at least one of an acrylic resin, a methacrylic resin, polyisoprene, a vinyl resin, an epoxy resin, a urethane resin, a cellulose resin, or a perylene resin.

The organic layer may have a thickness of about 2 μm to about 20 μm.

The touch screen layer may include a plurality of first sensing patterns and a plurality of second sensing patterns that are electrically insulated from the first sensing patterns, and the protection layer may directly contact the first sensing patterns and/or the second sensing patterns.

The display unit may include a thin film transistor (TFT), and a display element including, an organic light emitting device (OLED) including a first electrode electrically connected to the TFT, a second electrode opposite the first electrode, and an intermediate layer between the first and second electrodes.

According to one or more exemplary embodiments, there is provided a method of manufacturing a flat display apparatus, the method including forming a display unit on a first substrate, forming a touch screen layer on a second substrate, forming a protection layer, which includes an inorganic layer, on the second substrate to cover the touch screen layer, forming a sealing member on the first substrate or on the protection layer to surround the display unit, and to bond to the first substrate and to bond to the inorganic layer, aligning the first substrate with the second substrate such that the display unit and the protection layer face each other, and binding the first substrate and the second substrate together using the sealing member.

The touch screen layer may include a plurality of first sensing patterns and a plurality of second sensing patterns that are electrically insulated from the first sensing patterns, and the protection layer may directly contact the first sensing patterns and/or the second sensing patterns.

The protection layer may have a thickness of about 2 μm to about 100 μm.

The protection layer may have a thickness of about 10 μm to about 50 μm.

Forming the protection layer may include forming an organic layer covering the touch screen layer, and the inorganic layer of the protection layer may cover the organic layer, and may contact the second substrate at a region surrounding the organic layer.

The organic layer may have a thickness of about 2 μm to about 20 μm.

The method may further include performing an ashing process to remove edge tails of the organic layer.

The method may further include modifying a surface of the protection layer facing the display unit to improve adhesion to the sealing member.

As described above, according to the one or more of the above exemplary embodiments, the flat display apparatus may have an improved degree of touch sensitivity, and may be manufactured with an increased production yield.

BRIEF DESCRIPTION OF THE DRAWINGS

These and/or other aspects will become apparent and more readily appreciated from the following description of the exemplary embodiments, taken in conjunction with the accompanying drawings, in which:

FIG. 1 is a schematic cross-sectional view illustrating a flat display apparatus according to an exemplary embodiment;

FIG. 6 is a schematic flowchart illustrating a method of manufacturing the flat display apparatus depicted in FIG. 1.

DETAILED DESCRIPTION

Figure 1:
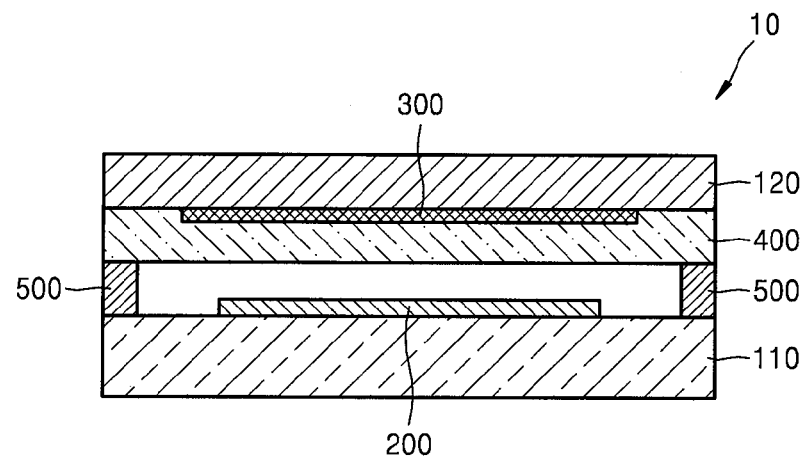

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
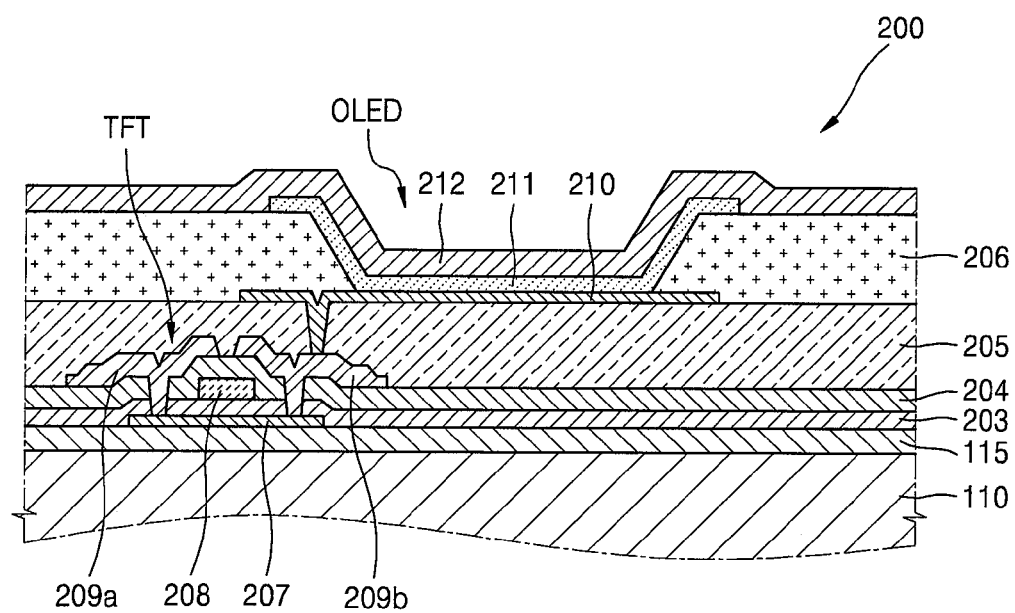
FIG. 2 is a schematic cross-sectional view illustrating an example of a display unit of the flat display apparatus depicted in FIG. 1.
Figure 3:
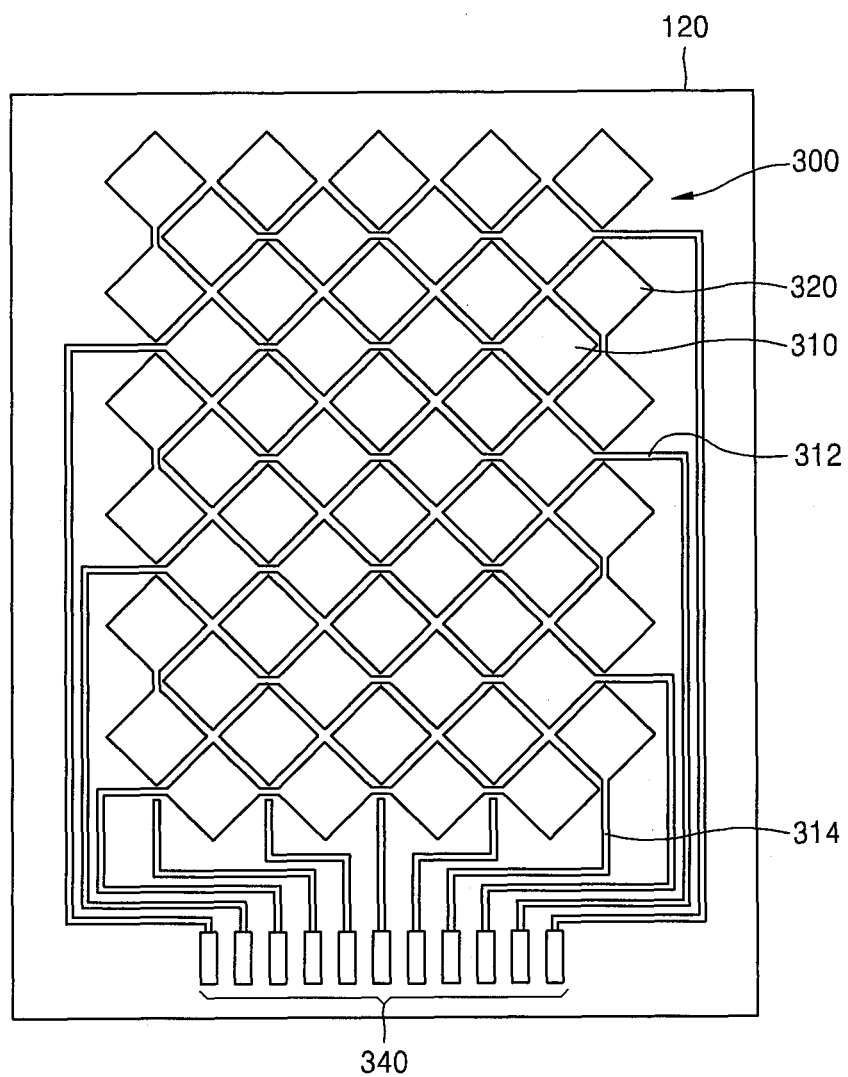
FIG. 3 is a schematic plan view illustrating an encapsulation substrate depicted in FIG. 1.

FIG. 1 is a schematic cross-sectional view illustrating a flat display apparatus 10 according to an exemplary embodiment, FIG. 2 is a schematic cross-sectional view illustrating an exemplary display unit 200 of the flat display apparatus 10 depicted in FIG. 1, and FIG. 3 is a schematic plan view illustrating an encapsulation substrate depicted in FIG. 1.

Referring to FIGS. 1 to 3, the flat display apparatus 10 of the exemplary embodiment may include a first substrate 110, the display unit 200 on the first substrate 110, a second substrate 120 opposite the first substrate 110, a touch screen layer 300 on a bottom surface of (e.g., underneath) the second substrate 120, a protection layer 400 covering the touch screen layer 300 at the bottom surface of the second substrate 120, and a sealing member 500 binding the first and second substrates 110 and 120 together.

The first substrate 110 may be formed of a transparent glass material including $SiO_2$ as a main component. However, the first substrate 110 is not limited thereto. In another example, the first substrate 110 may be formed of a transparent plastic material. The plastic material may be an insulative organic material selected from polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), and cellulose acetate propionate (CAP).

If the flat display apparatus 10 is a bottom emission type display apparatus, which is configured to emit light through the first substrate 110 when displaying images, then the first substrate 110 is formed of a transparent material. However, if the flat display apparatus 10 is a top emission type display apparatus that is configured to emit light in a direction away from the first substrate 110 when displaying images, then the first substrate 110 need not be formed of a transparent material, and may be formed of a metal. In this case, the first substrate 110 may include at least one of iron, chromium, manganese, nickel, titanium, molybdenum, stainless steel (SUS), Invar®, Inconel®, and Kovar®, although the first substrate 110 is not limited thereto. Invar® is a registered trademark of Imphy Alloys, a French Corporation. Inconel® is a registered trademark of Inco Alloys International, Inc., a Delaware corporation. Kovar® is a registered trademark of Westinghouse Electric & Manufacturing Company, a Pennsylvania corporation.

The display unit 200 is located on the first substrate 110, and is configured to form images that may be perceived by users. The display unit 200 may include display elements. For example, the display elements may be organic light emitting devices (OLEDs). However, the inventive concept is not limited thereto. For example, the display elements may be liquid crystal display elements.

Hereinafter, the display unit 200 will be described with reference to FIG. 2.

A buffer layer 115 may be located on the first substrate 110. The buffer layer 115 may form a flat surface at an upper side of the first substrate 110, and may block the ingress of foreign substances or moisture through the first substrate 110. The buffer layer 115 may include, for example: an inorganic material such as silicon oxide, silicon nitride, silicon oxynitride, aluminum oxide, aluminum nitride, titanium oxide, and/or titanium nitride; and/or an organic material such as polyimide, polyester, and/or acrylic. The buffer layer 115 may have a multi-layer structure that includes two or more of the listed materials.

Thin film transistors (TFTs) may be located above the first substrate 110. Each of the TFTs may include an active layer 207, a gate electrode 208, a source electrode 209a, and a drain electrode 209b.

The active layer 207 may include a semiconductor material, such as amorphous silicon or polycrystalline silicon. However, the exemplary embodiments of the present disclosure are not limited thereto. For example, the active layer 207 may include another material, such as an organic semiconductor material. In other exemplary embodiments, the active layer 207 may include an oxide semiconductor material. For example, the active layer 207 may include an oxide of a material selected from 12, 13, and 14 group metal elements, such as zinc (Zn), indium (In), gallium (Ga), tin (Sn), cadmium (Cd), and germanium (Ge), and combinations thereof.

A gate insulating layer 203 is located on the active layer 207. The gate insulating layer 203 may have a monolayer structure, or a multi-layer structure formed of one or more inorganic materials, such as silicon oxide and/or silicon nitride. The gate insulating layer 203 insulates the active layer 207 and the gate electrode 208 from each other.

The gate electrode 208 is located at an upper region of the gate insulating layer 203. The gate electrode 208 may be connected to a gate line through which an on/off signal is applied to the TFTs. The gate electrode 208 may be a monolayer structure, or may be a multi-layer structure including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu).

An interlayer insulating layer 204 is located on the gate electrode 208 to insulate the gate electrode 208 from the source electrode 209a and from the drain electrode 209b. The interlayer insulating layer 204 may have a monolayer structure or a multi-layer structure formed of one or more inorganic materials. For example, the inorganic materials may include a metal oxide or a metal nitride. Specifically, examples of the inorganic materials may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and/or zirconium oxide ($ZrO_2$).

The source electrode 209a and the drain electrode 209b are located on the interlayer insulating layer 204, and are in contact with respective regions of the active layer 207. Each of the source electrode 209a and the drain electrode 209b may be a monolayer or a multi-layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu).

FIG. 2 illustrates a top gate type TFT, in which the active layer 207, the gate electrode 208, the source electrode 209a, and the drain electrode 209b are sequentially formed. However, the present invention is not limited thereto. That is, the flat display apparatus 10 may include other types of TFTs, such as bottom gate type TFTs. Additionally, the TFTs may be electrically connected to the display elements, and may be protected by a planarization layer 205 covering the TFTs.

The planarization layer 205 may include an inorganic insulating layer and/or an organic insulating layer. The inorganic insulating layer may include a material such as $SiO_2$, SiNx, SiON, $Al_2O_3$, $TiO_2$, $Ta_2O_5$, $HfO_2$, $ZrO_2$, barium strontium titanate (BST), or lead zirconate titanate (PZT). The organic insulating layer may include a material such as general-purpose polymers (e.g., polymethylmethacrylate (PMMA) or polystyrene (PS)), polymer derivatives having phenolic groups, polymer derivatives having phenolic groups, acrylic polymers, imidic polymers, aryletheric polymers, amidic polymers, fluoric polymers, p-xylenic polymers, vinyl alcoholic polymers, and/or blends thereof. Alternatively, the planarization layer 205 may have a multi-layer structure formed by an inorganic insulating layer and an organic insulating layer.

The display elements may be located on the planarization layer 205. For example, each of the display elements may be an OLED including a first electrode 210, a second electrode 212 opposite the first electrode 210, and an intermediate layer 211 between the first and second electrodes 210 and 212.

The first electrode 210 may be located on the planarization layer 205, and may be electrically connected to the TFT through a contact hole formed in the planarization layer 205.

For example, the first electrode 210 may be a reflective electrode. For example, the first electrode 210 may include, for example: a reflective layer formed of silver (Ag), magnesium (Mg), aluminum (Al), platinum (Pt), palladium (Pd), gold (Au), nickel (Ni), neodymium (Nd), iridium (Ir), chromium (Cr), and/or a combination thereof; and a transparent or translucent electrode layer on the reflective layer. The transparent or translucent electrode layer may include at least one of indium tin oxide (ITO), indium zinc oxide (IZO), zinc oxide (ZnO), indium oxide ($In_2O_3$), indium gallium oxide (IGO), and/or Al-doped zinc oxide (AZO).

The second electrode 212 may be a transparent or translucent electrode. The second electrode 212 may be a thin metal film formed of lithium (Li), calcium (Ca), LiF/Ca, LiF/Al, aluminum (Al), silver (Ag), magnesium (Mg), and/or a compound thereof having a low work function. In addition, an auxiliary electrode layer or a bus electrode may be formed on the thin metal film of the second electrode 212 by using a transparent electrode forming material, such as ITO, IZO, ZnO, and/or $In_2O_3$. Therefore, the second electrode 212 may transmit light emitted from an organic emission layer included in the intermediate layer 211. That is, light emitted from the organic emission layer may be directly incident on the second electrode 212, or may be incident on the second electrode 212 after being reflected by the first electrode 210, which is a reflective electrode.

In the present exemplary embodiment, the display unit 200 is not limited to a top emission type. For example, the display unit 200 may be a bottom emission type display unit, in which light is emitted from the organic emission layer to the first substrate 110. In this case, the first electrode 210 may be a transparent or translucent electrode, and the second electrode 212 may be a reflective electrode. Alternatively, the display unit 200 may be a double side emission type display unit, which is configured to emit light through both top and bottom sides thereof.

A pixel defining layer 206 is formed of an insulative material on the first electrode 210. The pixel defining layer 206 may be formed by a spin coating method using at least one organic insulating material selected from polyimide, polyamide, acrylic resins, benzocyclobutene, and phenol resin. The pixel defining layer 206 exposes a region of the first electrode 210. The intermediate layer 211 including the organic emission layer is located at the exposed region of the first electrode 210. That is, the pixel defining layer 206 defines pixel regions of the OLEDs.

The organic emission layer of the intermediate layer 211 may include a low molecular weight organic material, or may include a high molecular weight organic material. In addition to the organic emission layer, the intermediate layer 211 may further include functional layers, such as a hole transport layer (HTL), a hole injection layer (HIL), an electron transport layer (ETL), or an electron injection layer (EIL).

The second substrate 120 is opposite the first substrate 110, and may protect the display unit 200 from moisture or oxygen. The second substrate 120 may be formed of a transparent material. For example, the second substrate 120 may have a plurality of overlapping structures formed of a material such as glass, plastic material, or a combination of organic materials and inorganic materials.

The touch screen layer 300 may be formed on the bottom surface of the second substrate 120. Here, the bottom surface refers to a surface of the second substrate 120 facing the display unit 200. That is, the touch screen layer 300 is not exposed to the outside of the flat display apparatus 10, thereby protecting the touch screen layer 300 while the flat display apparatus 10 is manufactured or used.

Referring to FIG. 3, the touch screen layer 300 may include: a plurality of sensing patterns 310 and 320; a bonding pad unit 340; and a plurality of connection lines 312 and 314 including first connection lines 312 and second connection lines 314 for respectively electrically connecting the sensing patterns 310 and 320 to the bonding pad unit 340. For example, the sensing patterns 310 and 320 and the connection lines 312 and 314 may be formed of a transparent material, such as indium tin oxide (ITO), indium zinc oxide (IZO), indium oxide (IO), Ga-doped zinc oxide (GZO), zinc oxide (ZnO), Al-doped zinc oxide (AZO), fluorine-doped tin oxide (FTO), and/or antimony-doped tin oxide (ATO).

The sensing patterns 310 and 320 may include a plurality of first sensing patterns 310 and a plurality of second sensing patterns 320. For example, each of the first sensing patterns 310 and the second sensing patterns 320 may have a rhombus shape. However, the first and second sensing patterns 310 and 320 are not limited thereto. That is, the first and second sensing patterns 310 and 320 of other embodiments may have other shapes. The first sensing patterns 310 may be arranged in one direction, and the first connection lines 312 may connect neighboring ones of the first sensing patterns 310.

The second sensing patterns 320 are electrically insulated from the first sensing patterns 310, and may be arranged in a direction crossing the direction of the first sensing patterns 310. For example, the second sensing patterns 320 may be arranged in a direction perpendicular to the direction in which the first sensing patterns 310 are arranged. The second connection lines 314 may connect neighboring ones of the second sensing patterns 320.

The touch screen layer 300 of the present embodiment is a capacitive overlay touch screen layer in which a capacitor is formed by the sensing patterns 310 and 320 and the second electrode 212. If a user touches the second substrate 120, another capacitor is formed by an external touch input unit (e.g., a user's finger) and the sensing patterns 310 and 320. That is, if a user touches the second substrate 120, two series-connected capacitors are formed, and capacitance varies. Then, a touch panel function may be realized by detecting a position and an amount of the capacitance variation.

The protection layer 400 is located on the bottom surface of the second substrate 120, and covers the touch screen layer 300. That is, the protection layer 400 has an area that is larger than the area of the touch screen layer 300, and thus makes contact with the first/bottom surface of the second substrate 120 at a region around/surrounding the touch screen layer 300. In addition, the protection layer 400 extends to a position at which the sealing member 500 is located to bind the first and second substrates 110 and 120 together (e.g., the sealing member 500 contacts the protection layer 400).

The protection layer 400 may be in direct contact with the first sensing patterns 310 and/or the second sensing patterns 320.

For example, if a dielectric layer is located between the first and second sensing patterns 310 and 320, the protection layer 400 may cover the touch screen layer 300 while making direct contact with the first sensing patterns 310 or the second sensing patterns 320 located on the dielectric layer.

In another example, if the first sensing patterns 310 and the second sensing patterns 320 are located on the same plane, and are electrically connected through structures such as bridges, the protection layer 400 may cover the touch screen layer 300 while making direct contact with the first sensing patterns 310 and with the second sensing patterns 320.

The touch screen layer 300 is located on (e.g., underneath) the bottom surface of the second substrate 120 facing the display unit 200. In this case, the distance between the touch screen layer 300 and the second electrode 212 may be small, such that electric interference between the second electrode 212 and the sensing patterns 310 and 320 may increase, and such that the touch sensitivity of the touch screen layer 300 may decrease. That is, the distance between the second electrode 212 and the sensing patterns 310 and 320 has to be large enough to prevent cross-talk between the second electrode 212 and the sensing patterns 310 and 320, and for this, the height/thickness of the sealing member 500 may have to be increased. However, a new process and material may be necessary to increase the height/thickness of the sealing member 500.

However, according to an exemplary embodiment, the protection layer 400 extends to a position at which the sealing member 500 is located, and bonds to the sealing member 500, and thus the distance between the first and second substrates 110 and 120 may be increased without varying the height/thickness of the sealing member 500. As a result, the flat display apparatus 10 may be manufactured at a high production yield, and cross-talk between the second electrode 212 and the sensing patterns 310 and 320 may be reduced or prevented to improve the touch sensitivity of the flat display apparatus 10.

The protection layer 400 may have a thickness of about 2 μm to about 100 μm. Herein, the thickness of the protection layer 400 refers to the thickness of a region on the touch screen layer 300. If the protection layer 400 has a thickness of about 2 μm or greater, cross-talk between the second electrode 212 and the sensing patterns 310 and 320 may be reduced, prevented, or minimized. However, if the protection layer 400 has a thickness greater than about 100 μm, excessively large stress may be formed in the protection layer 400, which includes an inorganic layer, and thus defects, such as cracks, may be formed in the protection layer 400. Moreover, if the protection layer 400 has a thickness of about 10 μm to about 50 μm, cross-talk between the second electrode 212 and the sensing patterns 310 and 320 may be more effectively reduced, and the flat display apparatus 10 may be relatively thin.

The protection layer 400 includes at least an inorganic layer, and the inorganic layer may be in contact with the sealing member 500. For example, the protection layer 400 may have a monolayer structure formed of an inorganic layer. The inorganic layer may include at least one of silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride.

As described above, if the protection layer 400 includes an inorganic layer, then the protection layer 400 may have improved heat resistance, and may also have improved adhesion to the sealing member 500, and thus, the flat display apparatus 10 may be used more reliably.

The sealing member 500 surrounds the display unit 200 between the first and second substrates 110 and 120, and binds the first and second substrates 110 and 120 together while sealing a space between the first and second substrates 110 and 120. For example, an end of the sealing member 500 bonds to the first substrate 110, and another end of the sealing member 500 bonds to the protection layer 400. Therefore, the display unit 200, which is located between the first and second substrates 110 and 120, may be protected from moisture, air, or other impurities.

The sealing member 500 may include glass frit and a filler. The glass frit forms the sealing member 500, and bonds to the first substrate 110 and to the protection layer 400 while being thermally fused and then hardened. The glass frit may include various components. For example, the glass frit may include at least vanadium oxide and/or bismuth oxide. In addition, the glass frit may include other components. For example, the glass frit may include at least one of $TeO_2$, $ZnO$, $BaO$, $Nb_2O_5$, $SiO_2$, $Al_2O_3$, $ZrO_2$, and/or $P_2O_5$.

The filler may restrict thermal expansion of the sealing member 500 when the sealing member 500 is formed using a laser beam, thereby effectively bonding the sealing member 500 to the first substrate 110 and to the protection layer 400. The filler may include at least chromium (Cr), copper (Cu), and/or manganese (Mn). In addition, the filler may include an oxide in the form of a spinel. For example, the filler may include at least $Cu(CrMn)_2O_4$.

Figure 4:
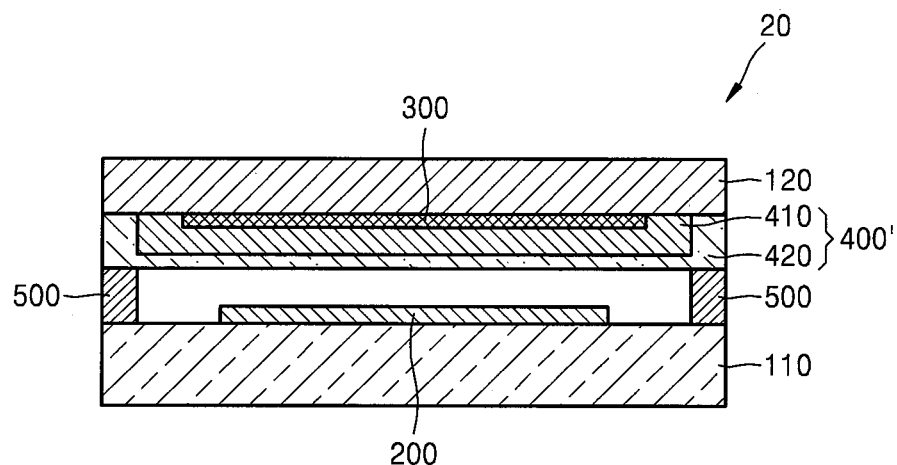
FIG. 4 is a schematic cross-sectional view illustrating a modification of the flat display apparatus depicted in FIG. 1.
Figure 5:
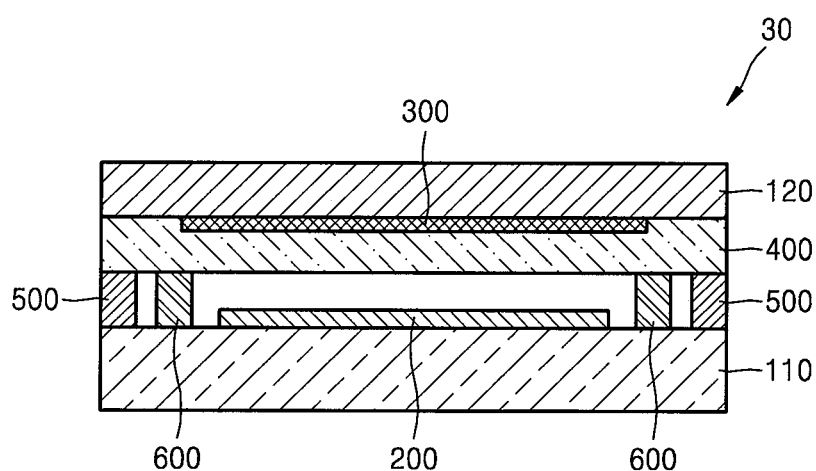
FIG. 5 is a schematic cross-sectional view illustrating another modification of the flat display apparatus depicted in FIG. 1.

FIG. 4 is a schematic cross-sectional view illustrating a modification of the flat display apparatus 10 depicted in FIG. 1, and FIG. 5 is a schematic cross-sectional view illustrating another modification of the flat display apparatus 10 depicted in FIG. 1.

Referring to FIG. 4, a flat display apparatus 20 may include a first substrate 110, a display unit 200 located on the first substrate 110, a second substrate 120 opposite the first substrate 110, a touch screen layer 300 located at a first/bottom surface of the second substrate 120, a protection layer 400' covering the touch screen layer 300, and a sealing member 500 binding the first and second substrates 110 and 120 together.

The first substrate 110, the display unit 200, the second substrate 120, the touch screen layer 300, and the sealing member 500 are the same as those described with reference to FIGS. 1 to 3, and thus, descriptions thereof will not be repeated here.

The protection layer 400' is located on the bottom surface of the second substrate 120 to cover the touch screen layer 300. Here, the bottom surface refers to a surface of the second substrate 120 that faces the display unit 200. The protection layer 400' may include an inorganic layer 420 that is bonded to the sealing member 500, and an organic layer 410 between the bottom surface of the second substrate 120 and the inorganic layer 420.

The organic layer 410 of the protection layer 400' covers the touch screen layer 300, and may include at least one of an acrylic resin, a methacrylic resin, polyisoprene, a vinyl resin, an epoxy resin, a urethane resin, a cellulose resin, and/or a perylene resin. The organic layer 410 relieves stress formed in the inorganic layer 420, and may be quickly formed compared to the inorganic layer 420. Therefore, the protection layer 400' may be formed more rapidly, and the flat display apparatus 20 may be manufactured with a higher production yield.

If the organic layer 410 has a thickness of about 2 μm or less, the organic layer 410 may not effectively relieve stress in the inorganic layer 420, and if the organic layer 410 has a thickness of about 20 μm or greater, it may be difficult to form the organic layer 410 at a desired position through a patterning process. Therefore, the organic layer 410 of the present embodiment may be formed to have a thickness of about 2 μm to about 20 μm.

The inorganic layer 420 entirely covers the organic layer 410, and has an area that is larger than the area of the organic layer 410, and thus the inorganic layer 420 makes contact with the bottom surface of the second substrate 120 at a region around, or that surrounds, the organic layer 410. The inorganic layer 420 may include at least one of silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride.

In FIG. 4, the protection layer 400' includes one organic layer 410 and one inorganic layer 420. However, the inventive concept is not limited thereto. For example, the protection layer 400' may include a plurality of organic layers 410 and a plurality of inorganic layers 420, which may be alternately arranged, wherein one of the inorganic layers 420 is formed at an outermost side of the protection layer 400' that bonds to the sealing member 500.

Referring to FIG. 5, a flat display apparatus 30 includes a first substrate 110, a display unit 200 located on the first substrate 110, a second substrate 120 opposite the first substrate 110, a touch screen layer 300 located on a first/bottom surface of the second substrate 120, a protection layer 400 covering the touch screen layer 300, and a sealing member 500 binding the first and second substrates 110 and 120. In addition, the flat display apparatus 30 further includes a getter 600 applied between an outer side of the display unit 200 and an inner side of the sealing member 500.

The getter 600 applied between the outer side of the display unit 200 and the inner side of the sealing member 500 may include a material configured to easily react with moisture and oxygen, such as alkali metal oxides, alkaline earth metal oxides, metal halides, lithium sulfate, metal sulfates, metal perchlorates, silica gel, and/or phosphorus pentoxide. Therefore, the getter 600 may improve the lifespans of devices such as OLEDs.

FIG. 6 is a schematic flowchart illustrating a method of manufacturing the flat display apparatus 10 depicted in FIG. 1, according to an exemplary embodiment. In the following description, the method of manufacturing the flat display apparatus 10 will be described with reference to FIG. 6 and FIGS. 1 to 3.

Referring to FIG. 6, the method of the exemplary embodiment may include: forming a display unit 200 on a first substrate 110 (operation S1); forming a touch screen layer 300 on a second substrate 120 (operation S2); forming a protection layer 400 on the second substrate 120 to cover the touch screen layer 300 (operation S3); forming a sealing member 500 on the first substrate 110 or on the second substrate 120 (e.g., on the first substrate 110 or on the protection layer 400 that is on the second substrate 120) to surround the display unit 200 (operation S4); and after aligning the first substrate 110 and the second substrate 120 with each other such that the display unit 200 and the protection layer 400 face each other, binding the first and second substrates 110 and 120 together using the sealing member 500 (operation S5).

The display unit 200 is the same as that described with reference to FIG. 2, and may have various structures, and thus a detailed method of forming the display unit 200 will not be described.

For example, the touch screen layer 300 may be formed by depositing a transparent material, such as indium tin oxide (ITO), indium zinc oxide (IZO), indium oxide (IO), Ga-doped zinc oxide (GZO), zinc oxide (ZnO), Al-doped zinc oxide (AZO), fluorine-doped tin oxide (FTO), and/or antimony-doped tin oxide (ATO), and by patterning the deposited transparent material through a photolithography process.

The protection layer 400 may include at least one inorganic layer, which may be formed by depositing an inorganic material on a bottom surface of the second substrate 120 by a method such as a sputtering method, an atomic layer deposition method, or a chemical vapor deposition method. Examples of the inorganic material include silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride. A surface of the protection layer 400 facing the display unit 200 may be modified to improve adhesion to the sealing member 500.

In another exemplary embodiment, as shown in FIG. 4, a protection layer 400' including an organic layer 410 and an inorganic layer 420 may be formed. In this case, the organic layer 410 may be formed by a method, such as a screen printing method, an inkjet printing method, or an imprinting method. The inorganic layer 420 may be formed to make contact with the second substrate 120, and may be formed in a region around/surrounding the organic layer 410. When the organic layer 410 is formed, edge tails may be formed because of a spreading phenomenon. Since the edge tails of the organic layer 410 may hinder contact between the inorganic layer 420 and the second substrate 120, the edge tails may be removed from the organic layer 410 before the inorganic layer 420 is formed. For example, the edge tails may be removed from the organic layer 410 by performing an ashing process under a nitrogen atmosphere. However, the inventive concept is not limited thereto.

The protection layer 400 may be formed by applying a paste to the first substrate 110 or the second substrate 120 to form a preliminary sealing member, and by firing and drying the preliminary sealing member.

The preliminary sealing member may be formed in a desired shape on the first substrate 110 or on the second substrate 120 by a screen printing method using a paste including glass frit and a filler. After the preliminary sealing member is formed, the first substrate 110 and the second substrate 120 are aligned with each other, and a laser beam is emitted to the preliminary sealing member. The laser beam may have a wavelength of about 700 nm to about 900 nm. While the preliminary sealing member is fused by the laser beam and then hardened, the first and second substrates 110 and 120 may be bound together.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims and their equivalents.

What is claimed is:

1. A flat display apparatus comprising:
   a first substrate;
   a display unit on the first substrate;
   a second substrate opposite the first substrate;
   a touch screen layer on a bottom surface of the second substrate that faces the display unit;
   a protection layer on the bottom surface of the second substrate, covering the touch screen layer, comprising an inorganic layer, and having an area that is larger than an area of the touch screen layer;
   a sealing member directly between the first substrate and the protection layer, surrounding the display unit by forming a perimeter around the display unit, and binding the first and second substrates together by directly contacting the inorganic layer to bind to the inorganic layer of the protection layer; and
   a getter between an outer side of the display unit and an inner side of the sealing member.

2. The flat display apparatus of claim 1, wherein the inorganic layer comprises at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

3. The flat display apparatus of claim 1, wherein the protection layer has a thickness of about 2 µm to about 100 µm.

4. The flat display apparatus of claim 1, wherein the protection layer has a thickness of about 10 µm to about 50 µm.

5. The flat display apparatus of claim 1, wherein the protection layer further comprises an organic layer that is between the bottom surface of the second substrate and the inorganic layer, and that covers the touch screen layer.

6. The flat display apparatus of claim 5, wherein the inorganic layer covers the organic layer, and contacts the second substrate at a region surrounding the organic layer.

7. The flat display apparatus of claim 5, wherein the organic layer comprises at least one of an acrylic resin, a methacrylic resin, polyisoprene, a vinyl resin, an epoxy resin, a urethane resin, a cellulose resin, or a perylene resin.

8. The flat display apparatus of claim 5, wherein the organic layer has a thickness of about 2 µm to about 20 µm.

9. The flat display apparatus of claim 1, wherein the touch screen layer comprises a plurality of first sensing patterns and a plurality of second sensing patterns that are electrically insulated from the first sensing patterns, and
   wherein the protection layer directly contacts the first sensing patterns and/or the second sensing patterns.

10. The flat display apparatus of claim 1, wherein the display unit comprises:
    a thin film transistor (TFT); and
    an organic light emitting device (OLED) comprising:
      a first electrode electrically connected to the TFT;
      a second electrode opposite the first electrode; and
      an intermediate layer between the first and second electrodes.

11. A method of manufacturing a flat display apparatus, the method comprising:
    forming a display unit on a first substrate;
    forming a touch screen layer on a second substrate;
    forming a protection layer, which comprises an inorganic layer and has an area that is larger than an area of the touch screen layer, on the second substrate to cover the touch screen layer;
    forming a sealing member on the first substrate or on the protection layer to surround the display unit by forming a perimeter around the display unit, to bond to the first substrate and to bond to the inorganic layer by directly contacting the inorganic layer while being directly between the first substrate and the inorganic layer;
    forming a getter between an outer side of the display unit and an inner side of the sealing member;
    aligning the first substrate with the second substrate such that the display unit and the protection layer face each other; and
    binding the first substrate and the second substrate together using the sealing member.

12. The method of claim 11, wherein the touch screen layer comprises a plurality of first sensing patterns and a plurality of second sensing patterns that are electrically insulated from the first sensing patterns, and
    wherein the protection layer directly contacts the first sensing patterns and/or the second sensing patterns.

13. The method of claim 11, wherein the protection layer has a thickness of about 2 µm to about 100 µm.

14. The method of claim 11, wherein the protection layer has a thickness of about 10 µm to about 50 µm.

15. The method of claim 11, wherein forming the protection layer comprises forming an organic layer covering the touch screen layer, and
    wherein the inorganic layer of the protection layer covers the organic layer, and contacts the second substrate at a region surrounding the organic layer.

16. The method of claim 15, wherein the organic layer has a thickness of about 2 µm to about 20 µm.

17. The method of claim 15, further comprising performing an ashing process to remove edge tails of the organic layer.

18. The method of claim 11, further comprising modifying a surface of the protection layer facing the display unit to improve adhesion to the sealing member.

* * * * *